United States Patent
Sheen

[11] Patent Number: 6,064,281
[45] Date of Patent: May 16, 2000

[54] SEMI-LUMPED BANDPASS FILTER

[75] Inventor: Jyh-Wen Sheen, Ilanc, Taiwan

[73] Assignee: Industrial Technology Research Institute, Taiwan

[21] Appl. No.: 09/105,626

[22] Filed: Jun. 26, 1998

[51] Int. Cl.[7] .................................................. H03H 7/01
[52] U.S. Cl. .................... 333/175; 333/185; 333/204; 333/134
[58] Field of Search ................................ 333/132, 134, 333/175, 176, 185, 204, 205

[56] References Cited

U.S. PATENT DOCUMENTS

| | | | |
|---|---|---|---|
| 2,915,716 | 12/1959 | Hattersley | 333/204 |
| 5,485,131 | 1/1996 | Fajen et al. | 333/204 X |
| 5,608,364 | 3/1997 | Hirai et al. | 333/185 X |

FOREIGN PATENT DOCUMENTS

| | | | |
|---|---|---|---|
| 4-246901 | 9/1992 | Japan | 333/204 |
| 4-284703 | 10/1992 | Japan | 333/204 |
| 1261-032 | 9/1986 | U.S.S.R. | 333/204 |

*Primary Examiner*—Justin P. Bettendorf
*Attorney, Agent, or Firm*—Proskauer Rose LLP

[57] ABSTRACT

The inventive bandpass filter is suitable for use in a multilayer ceramic (MLC) structure. Specifically, the filter is a semi-lumped type, formed by lumped capacitors and distributed transmission lines. Preferably, shorted transmission lines are used as equivalent inductors, which are connected with high value lumped capacitors to form resonators. Accordingly, the size of the resonators can be much smaller than ¼ of the signal wavelength. The bandpass filter preferably has attenuation poles very close to lower passband edge, which results in a very sharp rejection near the stopband. The inventive filter may be utilized as a receiver-end filter in, e.g., duplexer applications or for miniaturized applications, such as portable communications.

8 Claims, 6 Drawing Sheets

SEMI-LUMPED BANDPASS FILTER

FIELD OF THE INVENTION

This invention relates to electrical filters. More particularly, this invention relates to so-called semi-lumped, multi-layer and miniaturized filters, which are formed from, e.g., multi-layer ceramic technology. The invention is suitable for use in mobile communication instruments, such as portable telephones and cordless telephones.

BACKGROUND OF THE INVENTION

Electrical filters are utilized to transmit desired electrical signals by selecting or rejecting one or more signal components, related to frequency. Filters may generally be grouped as lowpass, highpass, bandpass and bandstop filters depending on their characteristics. A lowpass filter passes low frequency electrical signals, while rejects high frequency electrical signals. Conversely, a highpass filter suppresses the frequency electrical signals, while passes high frequency signals. A bandstop filter, however, passes all signals except the signals having frequencies between two selected frequency points. A bandpass filter, however, passes electrical signals in a particular frequency band between two frequency points (e.g., a high and low frequency point).

Depending on the implementation of the filter, the types of filters can also be grouped into three types, i.e., lumped, distributed and semi-lumped (which is constructed by lumped and distributed elements). The size of distributed elements, which is usually a section of the transmission line, is determined by the wavelength associated to the operational frequencies, such that lower frequencies translate into larger distributed elements. Accordingly, at frequencies lower than 200 Mhz, semi-lumped type or distributed type filters are impractical due to the unacceptably large size of the distributed elements. However, in the higher microwave frequency and millimeter-wave frequency regions, distributed type filters are commonly used due to their acceptable size and typically better performance than the lumped type filters. Lumped type filters are conventionally not suitable at frequencies higher than several hundred MHz as they become too lossy and are susceptible to high parasitic effects. Although the problem of signal loss in lumped elements can be improved in superconductor structures, such applications are limited.

At frequencies between several hundred MHz to several GHz, the relatively large size of distributed elements is not practical, e.g., in mobile communication instruments. The trends in designing mobile communication instruments are to reduce both physical size and power consumption. There are two typical ways to design a high performance miniaturized filter. The first is utilizing the semi-lumped configuration, mentioned above, and the second is utilizing a high dielectric constant structure. Semi-lumped type filters usually employ chip capacitors, interdigital type capacitors and/or metal-insulation-metal (MIM) capacitors, which are not as lossy as lumped inductors, and sections of distributed transmission lines which are usually much shorter than ¼ signal wavelength. Besides the miniaturization advantages of the semi-lumped configuration, as compared to distributed filters, this type of filter also has the ability to control the suppression of the periodic spurious signals that distributed type filters usually suffer.

Recently, high dielectric constant ceramic filters, such as coaxial or mono-block types, have become very popular due to their high performance and small size. The high performance is due, in part, to the round or smooth curves exhibited in the cross section of the transmission lines generate less conductor loss. The small size is due, in part, to the fact that the dielectric constant of ceramic is very high, resulting in a reduction of the signal wavelength. Since these kind of bandpass filters usually use ¼ wavelength transmissions as resonators or "J, K" inverters, they are not suitable to be implemented in low dielectric constant structures having a frequency region between several hundred MHz to several Ghz.

In addition, there are several other disadvantages utilizing ceramic filters. Due to their 3D profiles, each design requires a new molding model which is usually very expensive. Further, in fabrication of the coaxial type ceramic filter, different coaxial resonators are separately sintered and coated, and the blocks are electrically individually connected to each other, usually by soldering the connecting wires by hand. Further, the separate blocks must be fastened to some mounting support in a mechanically reliable way. The above indicates that the manufacture is difficult and costly. Although mono-block type ceramic filters are improvements of the coaxial type ceramic filters, they have essentially reached their limits with respect to miniaturization.

In addition, the low temperature cofirable ceramic (LTCC) technique has become popular in RF applications. Multi-layer ceramic (MLC) integrated circuits based on the LTCC technique have several advantages, such as the capability of mass production, 3D high integration, as well as comprising buried resistors, inductors and capacitors. Further, almost all the passive components can be fabricated in one manufacture processing. Except that a portion of the MLC circuit surface area is used for mounting active devices, almost all passive components can be buried into different ceramic layers to save real estate. Accordingly, the size of RF module can be reduced.

However, as stated with respect to MLC circuits modules, the use of ceramic type occupies some the surface area and requires additional processing steps to mount the active devices on the surface. Such use requires a larger surface area and increases manufacture complexity. Accordingly, there is a need for filters suitable to be fabricated and implemented in MLC structures that does not inhibit circuit miniaturization.

Recently, laminated planar bandpass filters have been developed for MLC structures. These filters consist of planar resonators that are buried in a high dielectric constant MLC structure, and can therefore be grouped as semi-lumped type filters. These bandpass filters use coupled transmission line sections and lumped planar capacitor pads for the coupling capacitor of the transmission line resonators. Such laminated planar filters may be treated as the variations of comb-line or stepped digital elliptic filters. However, the use of coupled transmission lines is disadvantageous because in MLC structures having low dielectric constants, the signal wavelength is relatively large. Utilizing coupled transmission lines further increases miniaturization concerns. In addition, the flexibility in designing laminated planar bandpass filters is inhibited by the control criteria of coupled transmission lines.

Accordingly, it is an object of the present invention to overcome the deficiencies in the prior art.

SUMMARY OF THE INVENTION

These and other objects are achieved by the present invention. To solve the abovedescribed shortcomings of the prior art, the present invention discloses inventive bandpass filters that are suitable in MLC structure. Instead of using coupled transmission lines, as with laminated planar filters, the present invention utilizes weak or non-coupling (non-EM) lines. The characteristics of the equivalent circuit have several advantages as follows:

1. The MLC structure of the present invention is relatively simplistic. The structures use pi-type capacitor networks that can be easily implemented in an MLC structure.
2. The control of the filters is straightforward by adjusting the lengths of the transmission line sections during filter fabrication.
3. The resonators which control the attenuation poles are the so-called semi-lumped type. Preferably, the resonators include large value lumped capacitors and grounded transmission lines. Accordingly, the length of the transmission lines can be much shorter than a ¼ signal wavelength to resonate, which in turn inherently reduces the filter size.
4. As stated, the shorted transmission lines are considered as weak or non-coupling. The isolation of the EM coupling between the transmission lines can be easily achieved by bending such lines or placing a grounded strip therebetween. This property can reduce the large spacing requirement between the transmission lines that is usually necessary to achieve sufficient isolation the lines.
5. This invention is suitable to be applied in low dielectric constant MLC structures due to its semi-lumped nature. The MLC integrated circuits are typically made of low dielectric constant materials, since a 50 Ω transmission line or high impedance line are difficult to utilize in high dielectric constant MLC structures. Accordingly, this invention can be integrated with RF active circuits in low dielectric constant MLC structures to fabricate compact and inexpensive RF circuit modules.
6. The embodiments of the present invention are configured to ensure that the bandpass filter attenuation pole is in close proximity to the passband edge. Accordingly, fewer resonators are required. Also, since a sharp cutoff is evident near the passband edge, this invention is suitable to be used as a receiver-end filter in duplexer applications.

BRIEF DESCRIPTION OF THE DRAWINGS

The following detailed description, given by way of example and not intended to limit the present invention solely thereto, will best be understood in conjunction with the accompanying drawings, where similar elements will be represented by the same reference symbol, in which.

DETAILED DESCRIPTION OF THE PRESENT INVENTION

Figure 1:
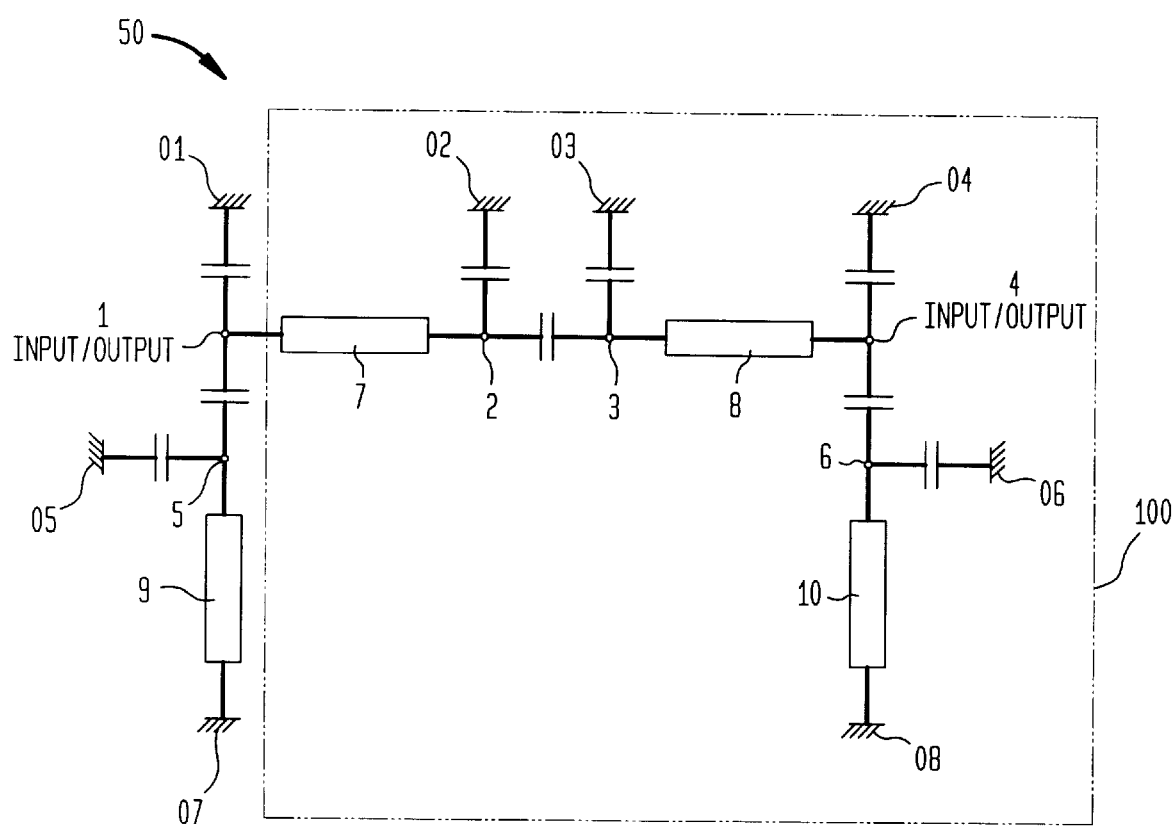
FIG. 1 schematically illustrates the inventive semi-lumped filter in accordance with an embodiment of the present invention.

FIG. 1 illustrates a preferred embodiment of the present invention. The inventive semi-lumped bandpass filter 50 includes ground nodes 01, 02, 03, 04, 05, 06, 07 and 08, arms 01-1, 02-2, 03-3, 04-4, 05-5, 06-6, 1-5, 2-3 and 4-6 which represent the lumped capacitors (or known as pi-type capacitor networks), and strips 7, 8, 9 and 10 which represent sections of transmission lines.

Each pi-type capacitor network and grounded transmission line forms a resonator (with the transmission line acting as an inductor). In FIG. 1, illustratively, the resonance of the resonator is controlled by capacitor 1-5 and transmission line 9. Note that the grounded capacitors 1-01 and 5-05 are grounded and illustratively have a small value.

Figure 2:
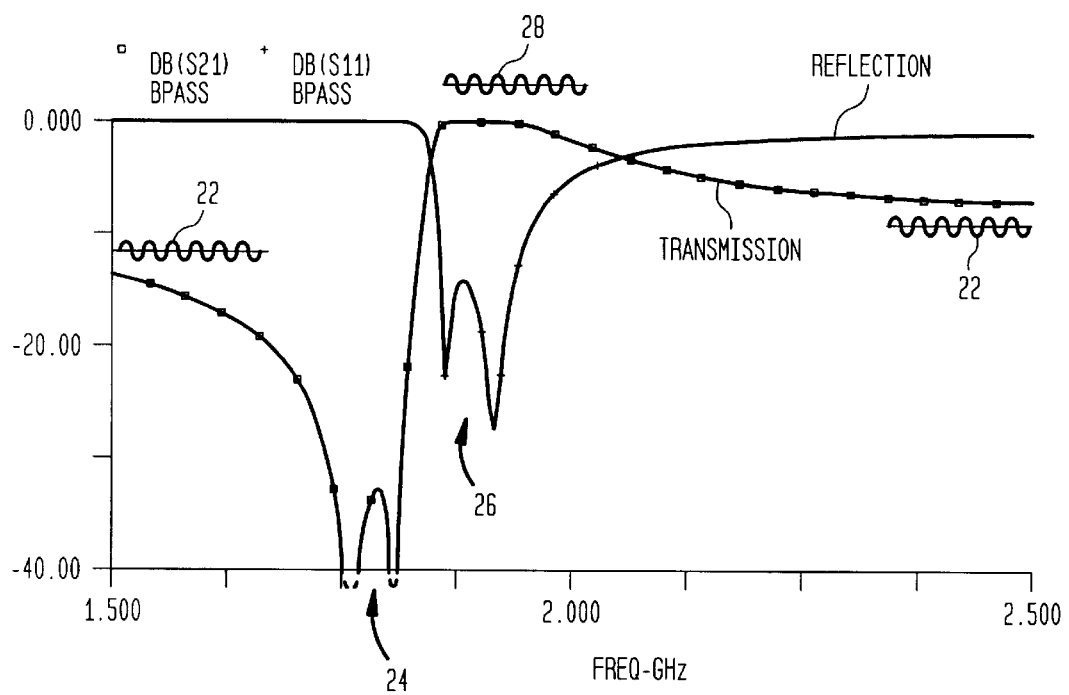
FIG. 2 graphically illustrates the performance of the bandpass filter of FIG. 1 in terms of db vs. GHz in accordance with the present invention.

FIG. 2 graphically illustrates the performance of filter 50. FIG. 2, graphs attenuation poles 24 that appear close to the lower passband edge 28, resulting in very sharp cutoff of outband signals. Further, attenuation poles 24 and 26 appear in the stopband 22, which positions can be easily tuned by varying the length of the shorted transmission line sections 9, 10. The property of the filter can be used to tune the frequency shift and the width change of the stopband with high rejection due to, e.g., a manufacture error during fabrication.

Referring back to FIG. 1, it should be noted that filter 50 may be fabricated using, e.g., microstrip circuitry, stripline circuitry or both in such MLC structure which will be described in greater detail below. In addition, note that the resonators which control the attenuation pole in FIG. 1 is semi-lumped type. A first resonator is formed by capacitors 1-5 and grounded transmission line 9, and a second resonator is formed by capacitors 4-6 and grounded transmission line 10. Accordingly, the resonators can be treated as series LC resonators. If the capacitor value is large, then the inductor value is small if the resonance is at a fixed frequency point, such that the transmission line length is proportionally short.

Further, with respect to FIG. 2, note that the bandpass filter attenuation pole is in close proximity to the passband edge. Accordingly, fewer resonators are required. Also, since a sharp cutoff is evident near the passband edge, this embodiment is suitable to be used as, e.g, a receiver-end filter in duplexer applications.

Figure 3:
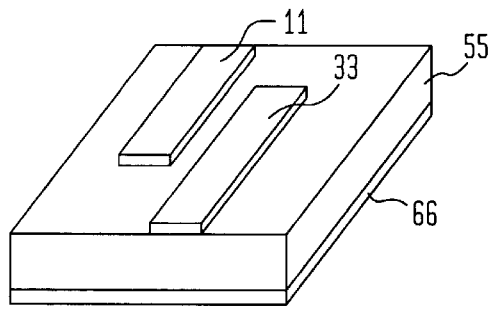
FIG. 3 illustrates an MLC structure utilizing microstrip circuitry having a first strip design in accordance with an embodiment of the present invention.
Figure 4:
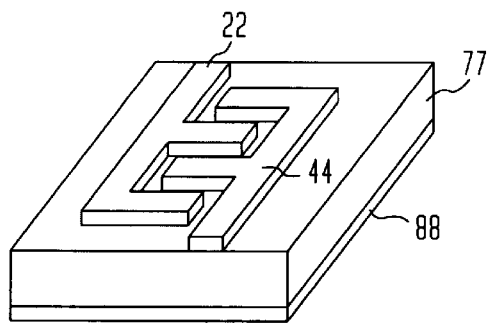
FIG. 4 illustrates an MLC structure utilizing microstrip circuitry having a second strip design in accordance with an embodiment of the present invention.

FIGS. 3 to 7 illustrate different embodiments of MLC structures, shown as pi type capacitor networks. FIG. 3 schematically illustrates an MLC structure utilizing microstrip circuitry. Specifically, two couple microstrip lines 11, 33 are placed on dielectric substrate 55 having a bottom ground plane 66. Preferably, substrate 55 is ceramic; however, other materials may be utilized, as desired. If specific filter requirements mandate that capacitors 1-5, 2-3 or 4-6 must be large values, the strips may be designed, as shown in FIG. 4. Two interdigital strips 22, 44 are placed on the dielectric substrate 77 having a bottom ground plane 88. The interdigital arrangement of the conductor strips increases the capacitance value of pi-type capacitor networks 1-3, 2-4.

Figure 5:
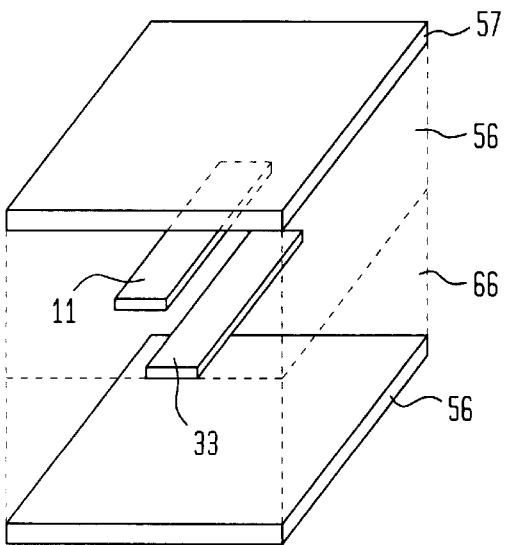
FIG. 5 illustrates an MLC structure utilizing stripline circuitry having a first strip design in accordance with an embodiment of the present invention.
Figure 6:
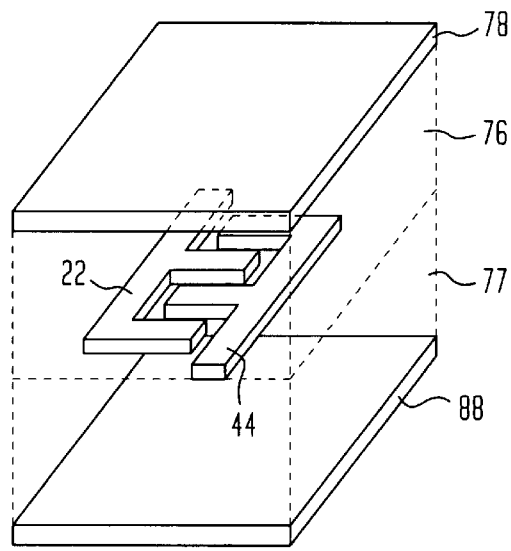
FIG. 6 illustrates an MLC structure utilizing stripline circuitry having a second strip design in accordance with an embodiment of the present invention.

FIG. 5 schematically illustrates an MLC structure utilizing stripline circuitry. The circuit of FIG. 5 is similar to the circuit of FIG. 3; however, a dielectric substrate 56 and a top ground plane 57 are added on substrate 55. In addition, the circuit of FIG. 6 is similar to the circuit of FIG. 4, however, a dielectric substrate 76 and top ground plane 78 are added on substrate 77.

Figure 7A:
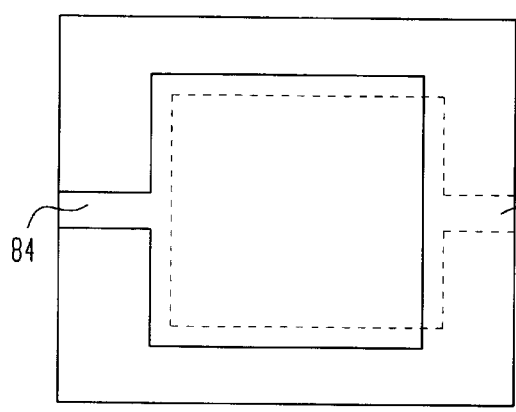
FIGS. 7A and 7B illustrate a MIM pi-type capacitor networks in accordance with the present invention.
Figure 7B:
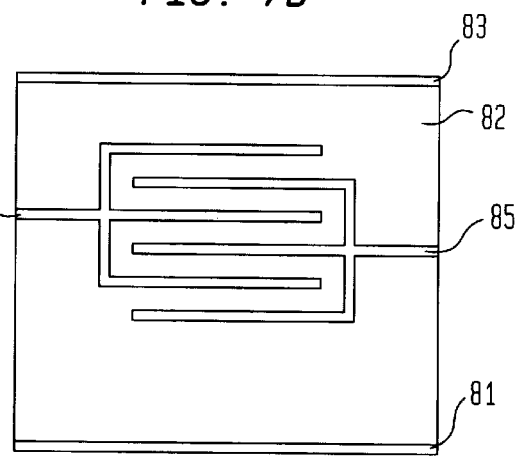

In a multi-layer structure, an MIM pi-type capacitor network can be implemented, as shown in FIG. 7A. Their structure comprises several conductor plates grouped as 84 and 85. These conductor plates are inserted in different layers of the dielectric substrate 82 between ground planes 81, 83. In a multi-layer microstrip circuit, shown in FIG. 7B, the top ground plane 83 and the dielectric substrate 82, between the top conductor plate of 84 and the top ground plane 83, can be removed. Note that with the circuit of FIGS. 7A and 7B, the number of the conductor plates of 84, 85 may vary. Further, the positions of the input point and the output point of 84, 85 may vary, as well, and their positions can be located at any layer and in any direction.

Figure 8:
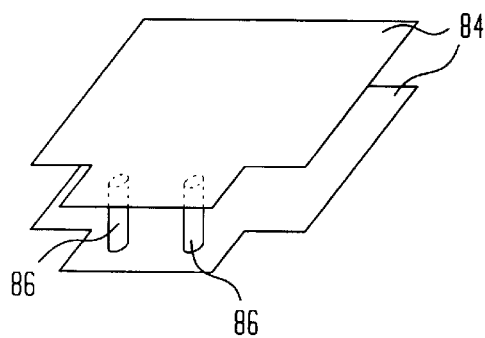
FIG. 8 illustrates the technique to equal the potential of grouped conductor plates using vias according to the present invention.
Figure 9:
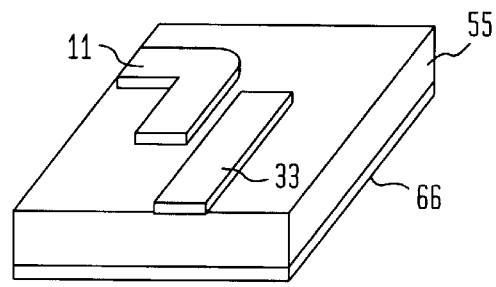
FIG. 9 illustrates a semi-lumped filter having conductor strips directed in different directions in accordance with the present invention.

A technique to equal the potential of the grouped conductor plates 84, 85 is shown in FIG. 8. Vias 86 are used to connect these conductor plates. Note that the number of vias 86 can vary. Additionally, the input direction and the output direction of the pi-type capacitor networks of FIGS. 3 to 7 may also vary, as shown, e.g., in FIG. 9. In FIG. 9, note that the conductor strips 11, 33 can be directed in different directions depending on the desired filter layout.

Figure 10:
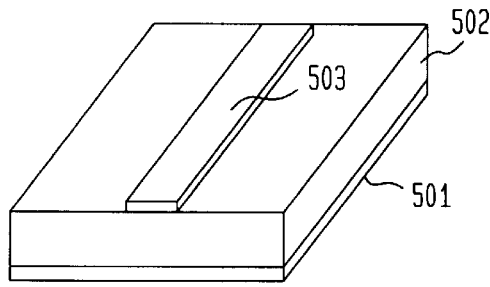
FIG. 10 illustrates a microstrip line in accordance with the present invention.
Figure 11:
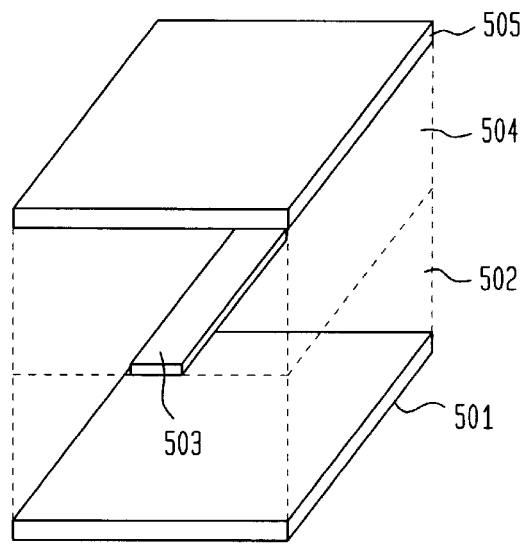
FIG. 11 illustrates a stripline in accordance with the present invention.

With reference back to FIG. 1, transmission lines 7 or 8 are shown in greater detail in FIGS. 10 and 11, as a conductor strip 503. In FIG. 10, conductor strip 503 is placed on a dielectric substrate 502 with a ground plane 501. This is the so-called microstrip line. In FIG. 11, a dielectric substrate 504 with a top grouped plane 505 is placed on dielectric substrate 502. This is the so-called stripline. The conductor strips 503 may be bent or meandered to minimize the size.

Figure 12:
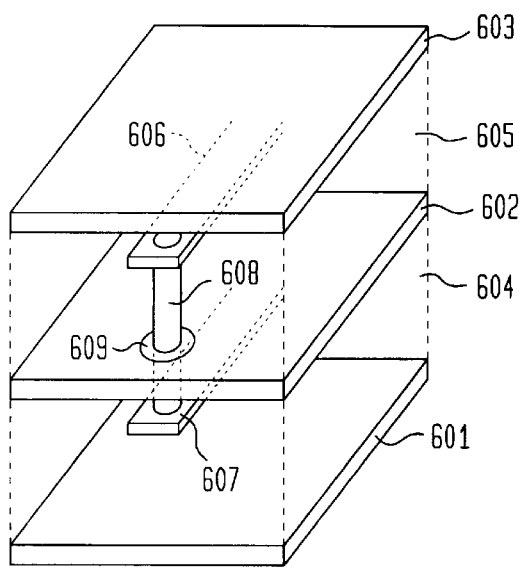
FIG. 12 illustrates a multi-layer microstrip line in accordance with the present invention.
Figure 13:
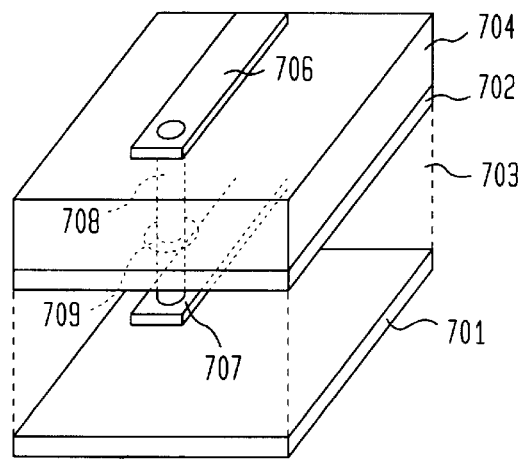
FIG. 13 illustrates a multi-layer stripline in accordance with the present invention.

In addition, the transmission lines 9 or 10 of FIG. 1 can also be implemented, as in FIG. 10 and FIG. 11. Additionally, they can be implemented by the multi-layer strip line technique, as shown in FIG. 12. For example, two dielectric substrates 604, 605 are placed between three ground planes 601, 602, 603. Conductor strips 606, 607 are connected by vias 608 passing through a "no conductor" area 609. The conductor strips in FIG. 12 can also be implemented in structures with more than two layers. Another implementation of lines 9 or 10 is shown in FIG. 13. This configuration is very suitable for fine filter tuning after fabrication. The structure of FIG. 13 includes ground planes 701, 702, dielectric substrates 703 and 704, microstrip line 706, and stripline 707. The connection of lines 706, 707 may be made by vias 708 passing through the no conductor area 709. As with the structure of FIG. 12, more than two layers can be fabricated. The transmission line sections 9 and 10 can also be bent or meandered in the same layer. As previously stated, the shorted transmission lines are considered as weak or non-coupling. The isolation of the EM coupling between the transmission lines can be easily achieved by bending such lines or placing a grounded strip therebetween. This property can reduce the large spacing requirement between the transmission lines that is usually necessary to achieve sufficient isolation the lines.

Figure 14:
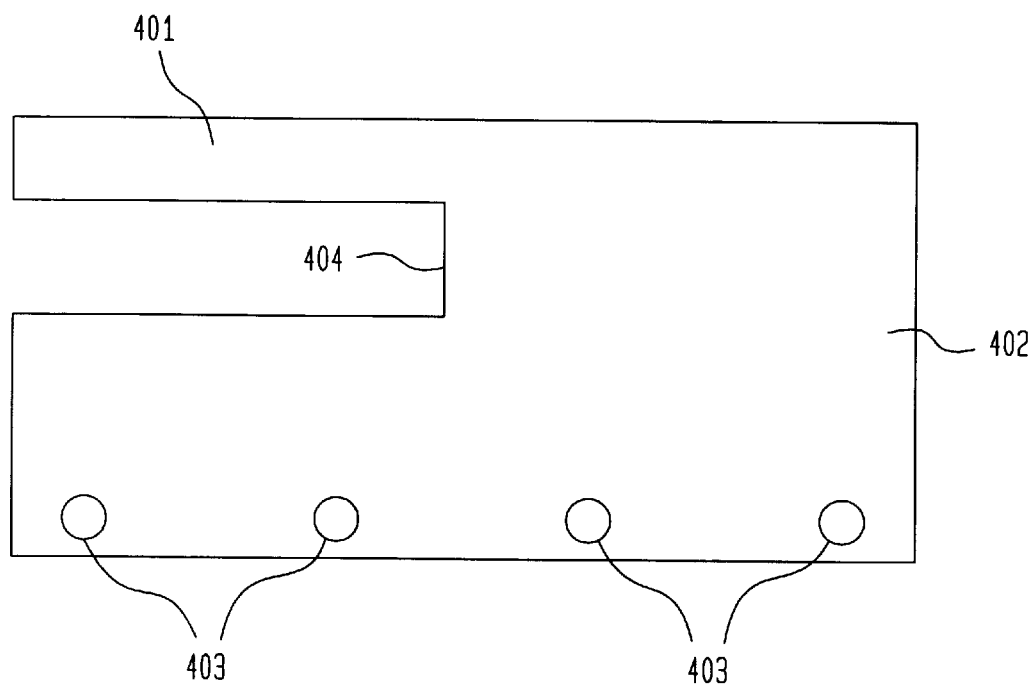
FIG. 14 schematically illustrates the tuning method of the bandpass filter in accordance wit the present invention.

FIG. 14 illustrates the tuning method of the bandpass filter. Specifically the ground connections of transmission lines 9 and 10 are shown. Lines 9 and 10 are grounded either by using a ground plane connection or by directly connecting the lines to a grounded conductor sidewall. The embodiment of FIG. 14 reduces signal loss that may occur when grounding by vias. The structure of FIG. 14 includes microstrip line or stripline 401, and a conductor pad 402 that is grounded by vias 403. The filter tuning can be made by using a laser trimmer to trim the area 404 for increasing the length of the transmission line 401. Note that the shape of the grounded conductor pad 402 can vary depending on the desired filter layout.

Figure 15:
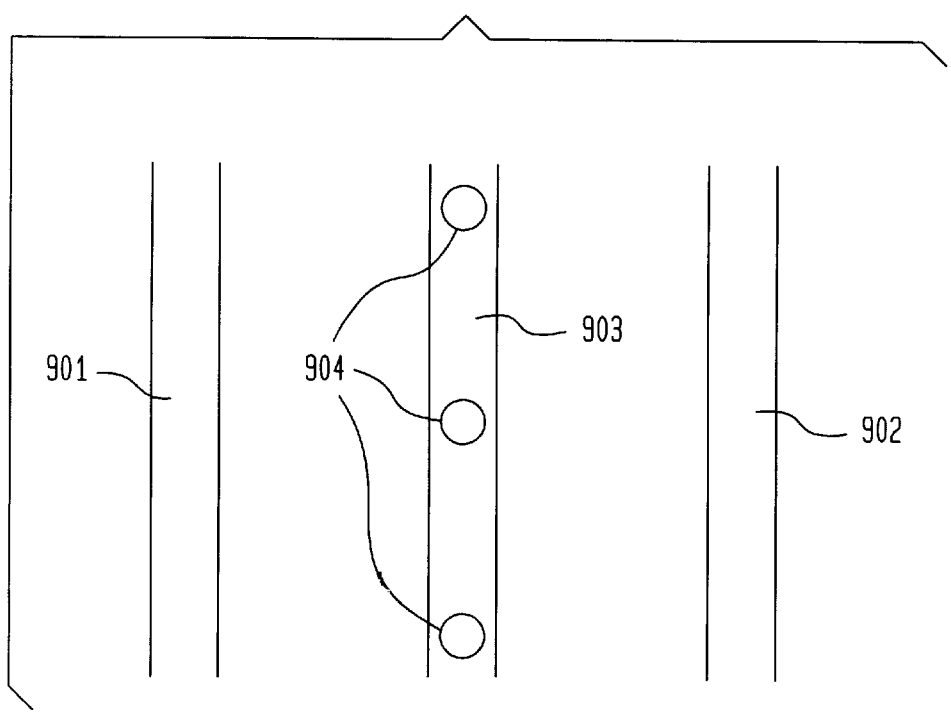
FIG. 15 illustrates an example of transmission line isolation in accordance with the present invention.

Since the transmission lines 9 and 10 are considered weak or non-coupling (non-EM), they should be isolated. Usually, the isolation can be achieved by bending transmission lines 9 and 10. However, the isolation may also be made by placing a conductor strip 903 grounded by vias 904 between transmission lines 901, 902, as shown in FIG. 15.

This invention is suitable to be applied in low dielectric constant MLC structures due to its semi-lumped nature. The MLC integrated circuits are typically made of low dielectric constant materials, since a 50 Ω transmission line or high impedance line are difficult to utilize in high dielectric constant MLC structures. Accordingly, this invention can be integrated with RF active circuits in low dielectric constant MLC structures to fabricate compact and inexpensive RF circuit modules.

Finally, the above-discussion is intended to be merely illustrative of the invention. Numerous alternative embodiments may be devised by those having ordinary skill in the art without departing from the spirit and scope of the following claims.

I claim:

1. A semi-lumped bandpass filter, comprising:

a first plurality of π-type capacitor network including a first capacitor coupled to a first node and a second node, a second capacitor coupled to the first node and a first ground node, and a third capacitor coupled to the second node and a second ground node;

a second plurality π-type capacitor network including a fourth capacitor coupled to a third node and a fourth node, a fifth capacitor coupled to the third node and a third ground, and a sixth capacitor coupled to the fourth node and a fourth ground node;

a third plurality π-type capacitor network including a seventh capacitor coupled to a fifth node and a sixth node, an eighth capacitor coupled to the fifth node and a fifth ground node, and a ninth capacitor coupled to the sixth node and sixth ground node;

a first transmission line strip coupled to the first node and the third node;

a second transmission line strip coupled to the fourth node and the fifth node;

a third transmission line strip coupled to the second node and a seventh ground node;

a fourth transmission line strip coupled to the sixth node and an eighth ground node;

a input port and a output port coupled to the first node and the fifth node;

wherein said filter includes at least two semi-lumped resonators connected in series with each other, said resonators comprising at least one of said first, second, and third plurality π-type capacitor networks coupled to at least one of said first, second, third and fourth transmission line strips.

2. The filter of claim 1, wherein said transmission line strips are formed on a first dielectric substrate, wherein said transmission line strips may be formed by one of microstrip or stripline circuitry.

3. The filter of claim 2, wherein said transmission line strips are formed by said stripline circuitry, such that said strips are formed between said first dielectric substrate and a second dielectric substrate.

4. The filter of claim 3, wherein the striplines are configured to form a multi-layer ceramic (MLC) device.

5. The filter of claim 1, further comprising at least one conductor side plane coupled to at least one of said transmission line strips, wherein said side plane being grounded by at least one via, such that said substantially non-coupling transmission lines are grounded.

6. The filter of claim 5, wherein said at least one conductor sideplane comprises a plurality of sideplanes, each grounded by said at least one via which connect said plurality of sideplanes.

7. The filter of claim 1, wherein said filter being comprised in a radio frequency (RF) module.

8. A semi-lumped bandpass filter, comprising:

a first plurality of π-type capacitor network including first capacitor coupled to a first node and a second node, a second capacitor coupled to the first node and a first ground node, and a third capacitor coupled to the second node and a second ground node;

a second plurality π-type capacitor network including a fourth capacitor coupled to a third node and a fourth node, a fifth capacitor coupled to the third node and a third ground node, and a sixth capacitor coupled to the fourth node and a fourth ground node;

a seventh capacitor coupled to the first node and the third node;

a first transmission line strip coupled to the second node and a fifth ground node;

a second transmission line strip coupled to the fourth node and a sixth ground node;

a input port and a output port coupled to the first node and the third node;

wherein said filter includes at least two semi-lumped resonators connected in series with each other, said resonators comprising at least one of said first, second, and third plurality π-type capacitor networks coupled to at least one of said first, second, third and fourth transmission line strips.

* * * * *